(12) United States Patent
Ben-Jacob et al.

(10) Patent No.: US 7,176,482 B1
(45) Date of Patent: Feb. 13, 2007

(54) DNA-BASED ELECTRONICS

(75) Inventors: Eshel Ben-Jacob, Tel Aviv (IL); Ziv Hermon, Tel-Aviv (IL); Shay Caspi, Tel-Aviv (IL)

(73) Assignee: Ramot At Tel-Aviv University, Tel-Aviv (IL)

( * ) Notice: Subject to any disclaimer, the term of this patent is extended or adjusted under 35 U.S.C. 154(b) by 323 days.

(21) Appl. No.: 09/724,436

(22) Filed: Nov. 28, 2000

(51) Int. Cl.
*H01L 29/72* (2006.01)
*H01L 29/12* (2006.01)
*C07H 21/04* (2006.01)

(52) U.S. Cl. .................................... 257/30; 536/23.1
(58) Field of Classification Search ............. None
See application file for complete search history.

(56) References Cited

U.S. PATENT DOCUMENTS 6,468,785 B1* 10/2002 Wang et al. ............. 435/287.2

FOREIGN PATENT DOCUMENTS

| EP | 0755044 | 1/1997 |
|---|---|---|
| JP | 1108780 | 4/1989 |
| WO | 9904440 | 1/1999 |
| WO | 9960165 | 11/1999 |

OTHER PUBLICATIONS

Porath et al. 2000, *Direct measurement of electrical transport through DNA molecules*. Nature 403:635-638.
Aich et al. 1999, *M-DNA: A Complex between Divalent Metal Ions and DNA which behaves as a Molecular Wire*. J. Mol. Bio. 294:477-485.
Ben-Jacob et al. 1999, *DNA Transistor and quantum bit element: Realization of nano-biomolecular logical devices*. Physics Letters A 263:199-202.
Seeman, NC. 1999, *DNA Engineering and its Application to Nanotechnology*. Trends Biotechnol. 17:437-43.
Ben-Jacob et al. *DNA-Nanoelectronics:Realization of a Single Electron Tunneling Transistor and a Quantum Bit Element*. Abstract for presentation at the Sixth Foresight Conference on Molecular Nanotechnology. Nov. 12-15, 1998.
Hermon et al. 1998, *Prediction of charge and dipole solitons in DNA molecules based on the behavior of phosphate bridges as tunnel elements*. Europhys. Lett 43:482-487.

(Continued)

Primary Examiner—Marjorie A. Moran
(74) Attorney, Agent, or Firm—Martin Fleit; Paul D. Bianco; Fleit Kain Gibbons Gutman Bongini & Bianco, P.L.

(57) ABSTRACT

Digital computational circuit comprising a network made of a plurality of identical repetitive DNA-based conductive elements. The DNA-based elements used for the purposes of the invention employ a P-bridge as a tunnel junction for a net charge. The DNA-based element of which the circuit is made may be a DNA SET transistor. The circuit may comprise a DNA resistor built from a plurality of SET transistor elements a series, with a constant over-threshold gate voltage. The circuit may further comprise NOT and NOR gates. The NOT gate can be made of a DNA-based transistor and a resistor, and the resistor can be made by using a DNA SET transistor with a constant over-threshold gate voltage, and by placing a plurality of such DNA SET transistors in series until the resistivity reaches the desired value. The NOR gate, on the other hand, can be built from two NOT elements wherein the output of the first NOT element is connected to the resistor of the second NOT element as it voltage supply.

5 Claims, 10 Drawing Sheets

OTHER PUBLICATIONS

Patolsky F et al., 2002, "Au-nanoparticle nanowires based on DNA and polylysine templates" *Angew Chem Int Ed Engl.* 41(13): 2323-7.

Hermon Z et al., 1997, "Do topological charge solutions participate in DNA activity"; arxiv:Physics/ 9712025, pp. 1-5.

Amman et al in 1989 see The charge-effect transistor, M. Amman, K. Mullen, and E. Ben-Jacob, *J. Appl. Phys.* 65(1):339-346.

* cited by examiner

DNA-BASED ELECTRONICS

FIELD OF THE INVENTION

The present invention relates to the field of Nano-electronic elements. More particularly, the invention relates to a method and apparatus for DNA based Single Electron Tunneling transistors (SET transistors) in which the chemical bonds of the DNA molecule act as tunnel junctions in the Coulomb blockage regime.

BACKGROUND OF THE INVENTION

During the last few decades, there has been an overwhelming technological progress in electronics. Such advancement enabled mass production of electronic circuits and devices, which are orders of magnitude smaller and faster then their recent ancestors. However, today, conventional methods for production of elements approach rapidly the theoretical limits for miniaturization and speed. The primary goal of nano-electronics is to overcome the limitations of the common lithographic technique for fabrication of electronic circuits. There are two principal approaches for construction of nano-elements. The first, the so called, "top down" approach is actually an extension of the conventional approach for fabricating small elements by manipulation of bulk material. It is usually associated with refinement of existing techniques (even lithography) in order to produce yet smaller particles. The "bottom up" approach tries to construct nano-element form their atomic or molecular building blocks. It was initiated with the invention of the Scanning Tunneling Microscope (STM). This apparatus provides a way to observe and handle a single molecule and even a single atom, so that a nanoscopic element can be assembled atom by atom. The invention of the STM, although being a major breakthrough, still could not solve the problem of mass production on molecular scale. In fact, even the construction of a single complex nano-element, which may contain few thousands atoms, is sometimes too slow to be practical. There is, however, an attempt to solve this problem from a different perspective. This approach calls for the construction of simple elements, which will self assemble to create the complex structure (e.g., an electronic microcircuit). Important candidates for the role of the self assembled elements are DNA molecules.

A DNA molecule is made of two long polymer strands, which are attached to each other by relatively weak (and breakable) hydrogen bonds (H-bonds) between bases along strands. Each strand is made of units (or grains), composed of a sugar and one of the four possible bases. Phosphorus bridges (P-bridges) between the sugars connect the grains. The specific base sequence along the DNA strand determines its identity. The bases may only be connected in specific pairs (the 'A' base to a 'T' and a 'G' to a 'C') thus the identity of one strand determines the identity of the other. Modern biochemistry provides straightforward relatively inexpensive procedures for synthesizing DNA with any desired base sequence, and for amplifying this molecule to any desired quantity. Special enzymes can cut DNA strands at desired location identified by specific base sequence, or paste two strand segments together. Other enzymes catalyze polymer chain reaction (PCR) in which arbitrary large population of DNA molecules with the same base sequence are created from as few as only one sample molecule. The base sequence can be tuned now, so that new artificial pattern would be assembled spontaneously. To demonstrate this point, suppose that a, b, c and d are specific base sequences, and that the following strands types are synthesized: a$\bar{b}$, b$\bar{c}$, c$\bar{d}$ and d$\bar{a}$ (where $\bar{a}$ is the complementary sequence of a etc.). It can be easily seen that these strands will assemble them self into a four-way junction pattern. More complicated patterns are produced in a similar manner, for example, only one exposed strand can be left at the ends of a double stranded molecule, to create a "sticky end" which may associate to complementary ends of other DNA molecules. The exact sequence of bases at each end serves as a specific code, which allows association only to the corresponding complementary code. By carefully designing these ends, complex structures, which self assemble from its DNA building blocks, can be produced. In this way, many molecular topologies, such as cubes, octahedrons and various knots, were realized. (see, for example, N. C. Seeman, Trends in Biotechnology, Vol. 17, (1999), p. 437, and references therein). Similar strategies are used in order to produce molecular micro-patterns. For example, two-dimensional lattices based on DNA, which have stripes patterns in the 10-nanometer scale were actually manufactured in the art.

Additional techniques were developed in order to manipulate a single DNA molecule. These methods involve the use of optical tweezers, Atomic Force Microscope (AFM), and various mechanical instruments such as glass micro needles, magnetic beads, etc. Using such techniques, DNA polymer may be stretched, twisted and separated into two single strands. The development of a method for coating a DNA strand with metal was a major step towards the goal of building DNA based electronic devices and circuits. For this purpose, the DNA is first attached at both ends to electrodes, which connect it to an external apparatus. After being coated, the molecule serves as a very thin conducting wire. This method may be modified to enable selective coating. Some known molecules, such as enzymes, recognize specific base sequences and attache to the DNA at these location. These molecules prevent coating in the region they occupy. After they are removed, some parts of the DNA molecule are left exposed.

An additional and much simpler technique for making conductive DNA molecules is to use molecules with only GC base pair (i.e. Poly-G Poly-C DNA molecules). Experiments, such as the one by Porath et al. Nature, Vol. 403, (200), p. 635, demonstrated that such molecules conduct current.

Doping the DNA molecule with acceptors and donors molecules can enhance the conductivity. Attachment of donors and acceptor to DNA is currently available process and was used as an experimental tool where the fluorescent response of the acceptor served as indication for electron transfer through the DNA.

Another additional technique for making conductive DNA molecules is to use M-DNA, which is a complex of DNA with divalent metal ions, such as, $Zn^{2+}$, $Co^{2+}$ or $Ni^{2+}$. Upon addition of these metal ions, at pH conditions above 8, the pH decreases such that one proton is released per base pair per metal ion. It was demonstrated that M-DNA behaves as a molecular conducting wire by Aich et al., journal of molecular biology, 294 (2), 1999.

"DNA—Nanoelectronics: Realization of a Single Electron Tunneling Transistor and a Quantum bit Element", The Sixth Foresight Conference on Molecular Nanotechnology, November 1998, discloses an idea of logical devices that are based on metal coated DNA SET transistor, however this article does not describe how to build such logical devices.

WO99/04440 "Microelectronic Components and Electronic Networks Comprising DNA" discloses a microelectronic network that is fabricated on a fibrous skeleton by binding or complexing electronically functional substances to the nucleic acid skeleton. The skeleton comprises fibers with nucleotide chains. The assembly of the fibers into a network is based on interactions of nucleotide chain portions of different fibers. However, it does not deal with the electrical properties of the DNA molecule itself.

Pat. No. WO99/60165 "Chemically Assembled Nano-Scale Device" discloses providing nano-scale devices, including electronic circuits, using DNA molecules as a support structure. DNA binding proteins are used to mask regions of the DNA as a material, such as a metal is coated onto the DNA. Included in the invention are DNA based transistors, capacitors, inductors and diodes. The present invention also provides methods of making integrated circuits using DNA molecules as a support structure. Methods are also included for making DNA based transistors, capacitors, inductors and diodes. However, as the first patent application, it does not deal either with the electrical properties of the DNA molecule itself.

All the prior art methods described above have not yet provided satisfactory solutions to the problem of providing commercially useful DNA-based single electron logical elements.

It is an object of the present invention to provide a method and apparatus for DNA-based single electron logical elements.

Other objects and advantages of the invention will become apparent as the description proceeds.

SUMMARY OF THE INVENTION

The invention is directed to a digital computational circuit comprising a network made of a plurality of identical repetitive DNA-based conductive elements. The DNA-based elements used for the purposes of the invention employ a P-bridge as a tunnel junction for a net charge.

According to a preferred embodiment of the invention the DNA-based element of which the circuit is made is a DNA SET transistor.

According to another preferred embodiment of the invention the circuit comprises a DNA resistor built from a plurality of SET transistor elements a series, with a constant over-threshold gate voltage.

The circuit of the invention may further comprise NOT and NOR gates. The NOT gate can be made of a DNA-based transistor and a resistor, and the resistor can be made by using a DNA SET transistor with a constant over-threshold gate voltage, and by placing a plurality of such DNA SET transistors in series until the resistivity reaches the desired value. The NOR gate, on the other hand, can be built from two NOT elements wherein the output of the first NOT element is connected to the resistor of the second NOT element as it voltage supply.

The circuit of the invention may further comprise a clock, which is conventional.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

In order to develop an electronic model for DNA, effective electromagnetic attributes are assigned to different parts of the molecule that should be consistent with their basic molecular properties. First, the P-bridges between neighboring grains of the DNA are examined. They are composed of two oxygen atoms transversely connected to a phosphorus atom. These oxygens share three electrons with the phosphorus, giving rise to two sigma bonds and one pi bond. As the electron can be shared with both oxygens, it resembles an electron in a double well potential and occupies the lowest level. When an additional electron approaches the well, it encounters a barrier due to the energy gap of the next level of the well. However, since this barrier is narrow and not very high, the approaching electron can tunnel through it. Therefore it has been found, and this is an object of the present invention, that a P-bridge can form a tunnel junction for a net charge (i.e. an extra charge beyond the equilibrium value). In the hydrogen bonds between the bases, nitrogen and oxygen atoms share a proton. As the proton can shift between the bond atoms, it can effectively screen a net charge density on either side of the bond. As a result, the net charge accumulates on the sides of the H-bond, and the bond can be viewed as a capacitor. The inductive property of the bases and the sugars, which reflects the hopping of additional electrons in these groups, should also be taken into account. Combining all these considerations together a simple effective model can be provided which corresponds to the electrodynamics of a DNA molecule. Such model can be used to predict possible charge and dipole soliton excitation in a single strand and a double strand DNA. (see, E. Ben-Jacob et al., Europhys. Lett, Vol. 43, (1998) p. 482).

Figure 1:
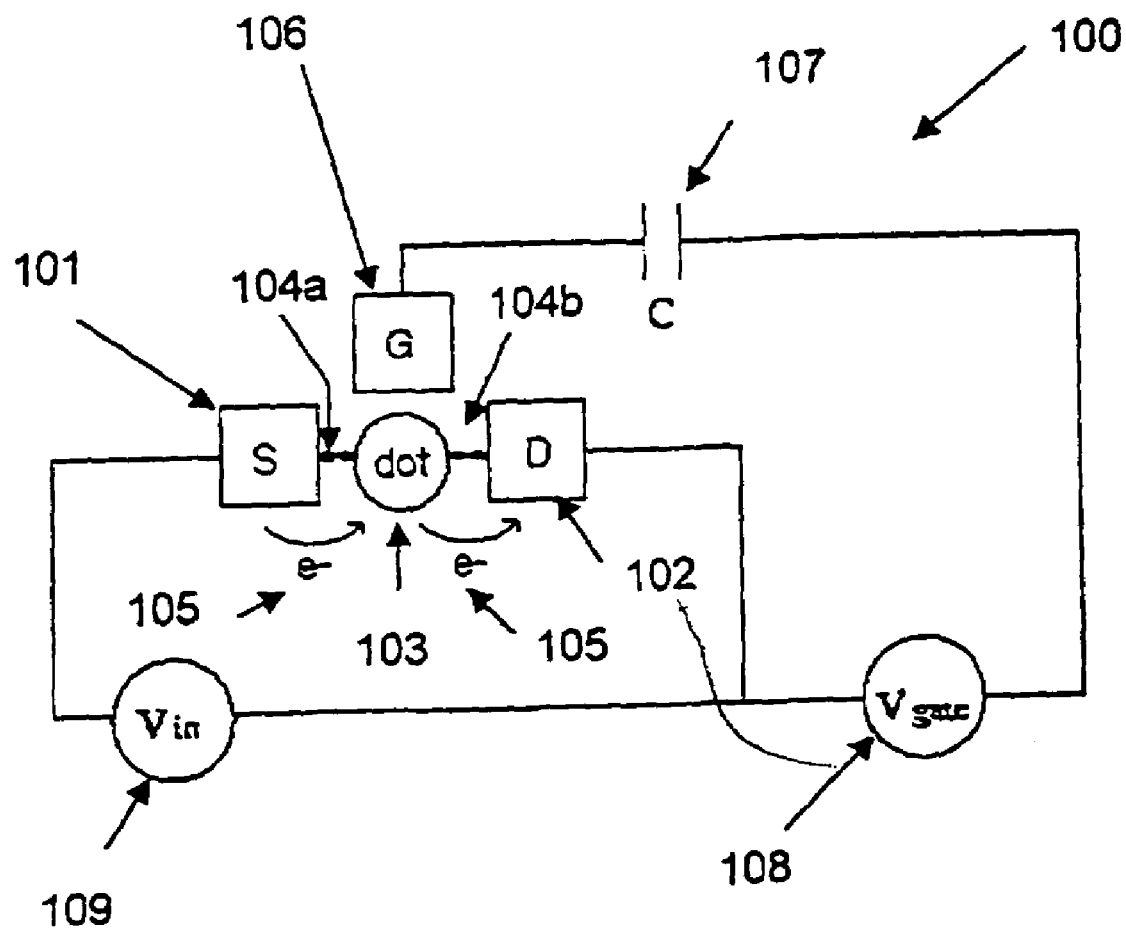
FIG. 1 is a prior art representation of SET transistor circuit.

FIG. 1 is a prior art representation of SET transistor 100. The operation of this device is based on the coulomb blockade effect. This effect is pronounced in systems that contain grain elements with very low capacity such that the charging energy due to single electron tunneling into the grain is much bigger than thermal energy. This effectively blocks tunneling of electrons into the grain unless its electric potential is lowered by an external voltage source.

The SET transistor device 100 that is represented here is built from a small grain (i.e. quantum dot) 103 which is connected to two external leads 101, 102 by thin barriers 104a, 104b (i.e. tunnel junctions) between them, and by a capacitor 107 to a gate voltage. The two external leads 101, 102 are a source lead electrode 101 and a drain lead electrode 102. When applying a bias voltage 109 between the two lead electrodes 101 and 102, a single electron 105 hops (via quantum tunneling) from the source lead 101 into the quantum dot 103, and then hops from the quantum dot 103 into the drain lead 102.

According to the prior art, when the voltage value of gate 108 is zero, electron flow through the quantum dot 103 is suppressed if the voltage value of source 109 is below the threshold value needed to overcome the coulomb blockade. If the voltage value of source 109 increases above threshold, the current increases linearly. Applying voltage to gate 108 can reduce the threshold point. If the voltage value of source 109 was originally just below the threshold point, the gate 108 would switch the transistor from a non-conductive to a conductive state. If the voltage value of gate 108 is increased even further, the current start oscillating with a period of e/C, where C is the capacitance of the gate capacitor 107 and e is the charge of an electron. This periodicity is due to the fact that changing the charge on the capacitor 107 by an integral number of electrons does not change the conduction properties of the quantum dot 103. Maximal current is observed when the voltage value of gate 108 is e/2C.

According to one embodiment of the invention a SET transistor as described hereinabove can be realized using a M-DNA molecule. In order to fabricate an M-DNA based SET transistor the active core of the DNA must be protected from dismutation to M-DNA. The active core of the DNA based SET transistor is equal to the quantum dot 103 in the SET transistor 100. This protection of the active core is done by an attachment of proper enzyme, which recognize specific base sequence. A method of attaching a proper enzyme in order to protect the active core from dismutation to M-DNA is first by methylate the core (Methylation of C-5 in cytosine base is induced by specific methyltransferases), and then using enzymes, which recognize the methylated part and attache to it. There are, however, many known enzymes which attache to specific cites. Synthesis of such enzymes is a standard biochemical procedure. They recognize typically a sequence of about 5 base pairs, so this may be chosen as the size of the active core, and the sequence at the core should match the one recognized by the protecting enzyme.

After the enzyme protects the core, the pH should be reduced below 8 and ion metal should be added to the solution, to induce translation to the M-DNA state in the non-protected parts of the DNA. After completion of this chemical reaction, the metal ions are removed from the solution. The protecting enzymes can then be removed by standard biochemical technic.

Such procedure can now by applied in order to fabricate all the molecular elements needed to construct a SET transistor, or, generally, any DNA-based molecular electronic device.

Figure 2:
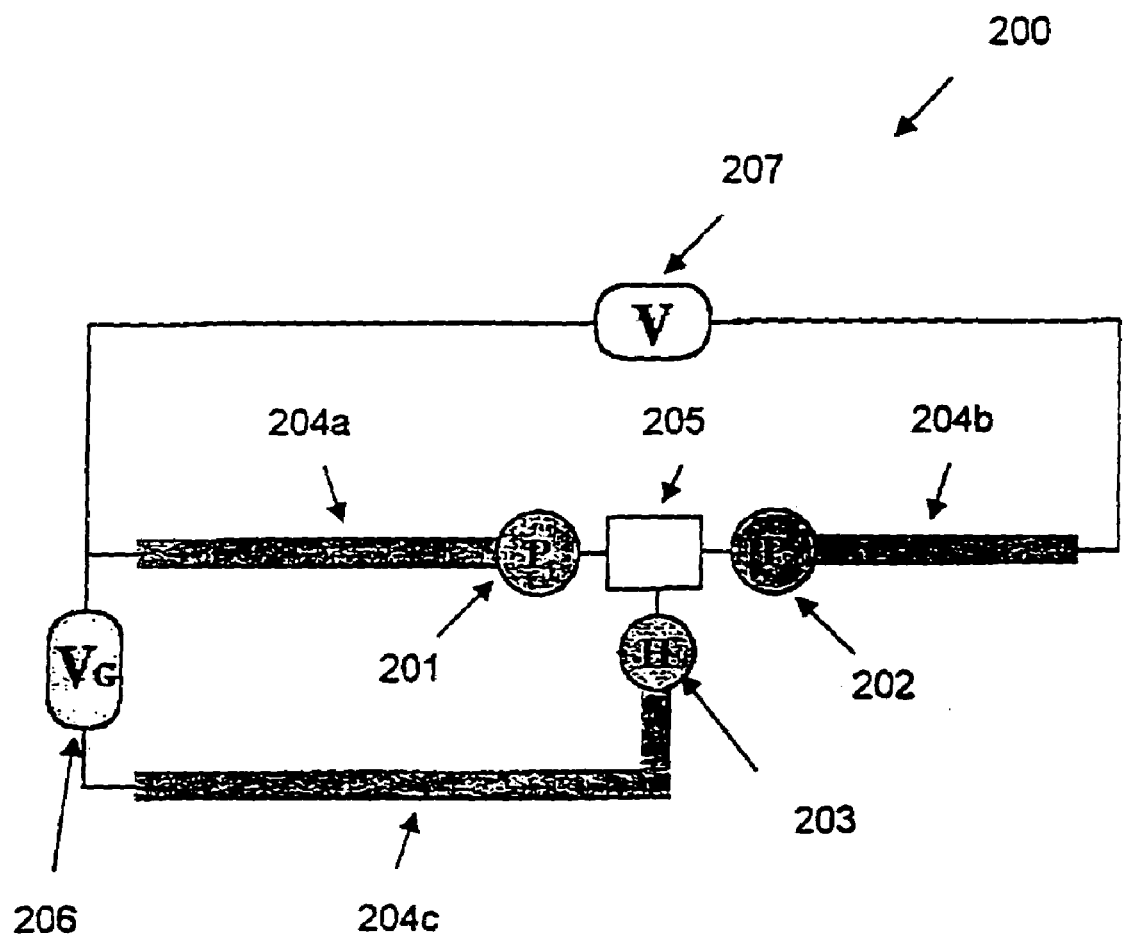
FIG. 2 schematically illustrates of a DNA SET transistor circuit according to an embodiment of the invention.

FIG. 2 schematically illustrates an M-DNA SET transistor circuit 200. The Phosphor bridges (P-bridges) 201, 202 are the tunneling elements and the Hydrogen bonds (H-bonds) 203 form an effective capacitor. The thick lines 204a, 204b, 204c represent a M-DNA molecule and the box in the middle represents the grain 205 formed by the exposed Sugar and base.

It is assumed that part of a DNA is conducting, using the M-DNA method disclosed hereinabove, so that a small piece containing two P-bridges is kept protected from dismutation to M-DNA. The P-bridges 201, 202 play the part of the tunnel junctions where the bare DNA is the grain 205. The gate 203 is produced by coating another strand leaving its edge bare so to attach itself to the bare part of the first strand through the H-bond 203. This bond 203 serves as an effective capacitor so that the charge on this bond controls the conductivity through the device. In fact, there is a natural gap in its density of states $D_{gr}$. This gap can actually improve the I-V characteristics of the SET transistor, i. e. produce a sharp step similar to that, which appears in a super-conducting SET transistor.

From a practical point of view, it may be harder to fabricate a DNA-based device in which there is just a single bare sugar-base grain connected by two P-bridges 201, 202 to the M-DNA electrodes and by a single H-bond 203 to the gate. In order to increase the structural stability of the SET transistor device (namely, the mechanical attachment via hydrogen bonds between the main grain and the gate base), there is a need to use a larger section of the molecule that contains few grains. This, nevertheless, will only improve the characteristics of the device, as it increases the energy gap and therefore sharpens the transition from non-conductive to conductive state. If there is still structural instability, this may be obviated by using enzymes, which are designed to attach to the DNA strands at specific points and support the construction. It is necessary to ensure, however, that such a procedure will not disturb the electronic properties of the junction. Such problems demand more detailed biochemical modeling of the molecular structure and extensive experimental work.

Figure 3A:
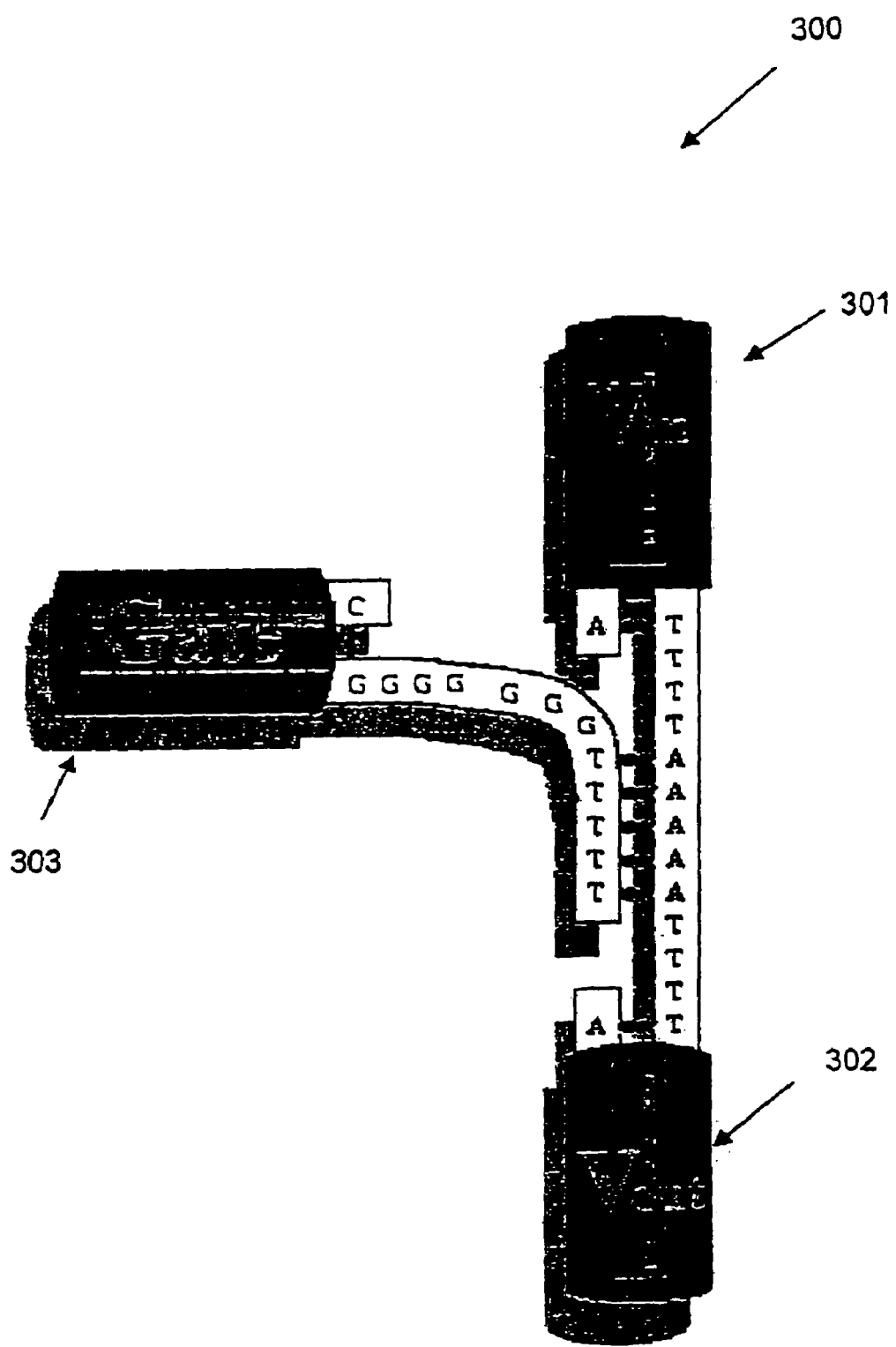
FIG. 3A schematically illustrates a DNA SET transistor which has a few grains (at nucleotides 5–9 of SEQ ID NO:1) connected to the gate (SEQ ID NO:2) according to an embodiment of the invention.

FIG. 3A schematically illustrates a DNA SET transistor 300 which has few grains connected to the gate according to an embodiment of the invention. Choosing the base sequence properly allows the pre-synthesized strands to attach one to the other spontaneously. The thick cylinders 301, 302, 303 represent the M-DNA part of the molecule. In addition to the fact that the conductivity can be achieved by M-DNA, it can also be achieved by other means too, such as using Poly-G Poly-C sections. Therefore, according to another embodiment of the invention, a doped Poly-G Poly-C strands DNA segment can be used as the conductors in the DNA SET transistor based circuit 200 instead of the M-DNA. If there is a need to increase the conductance of the bare molecule, it can be doped by donor or acceptor impurities. There are enzymes, which act as electron donors or acceptors and attache themselves spontaneously at preselected points along the DNA. Small segments with specific base code should be inserted, however, into Poly-G and Poly-C strands, in order to control the binding properties of Poly-G and Poly-C strands or to be used as sticky ends. If these specific coding segments would interrupt the electric conductance through the DNA, it would be possible to either dope these segment to bridge non-conductive gaps, or to use the M-DNA method.

It is further possible to use the fact that AT base pair has larger barrier for electron transport than the Poly-G Poly-C base pair, in order to tune the properties of the DNA SET transistor. By altering the base sequence at the active core of the SET transistor it is possible to modify its electric characteristic until obtaining the optimal desired behavior. It is also possible to reverse the Poly-G Poly-C base pair (i.e. part of one strand is GGGCGG and the corresponding complimentary strand is CCCGCC, where every G and C represent in concordantly Poly-G and Poly-C) to modify the electrical properties in a more subtle way.

Figure 3B:
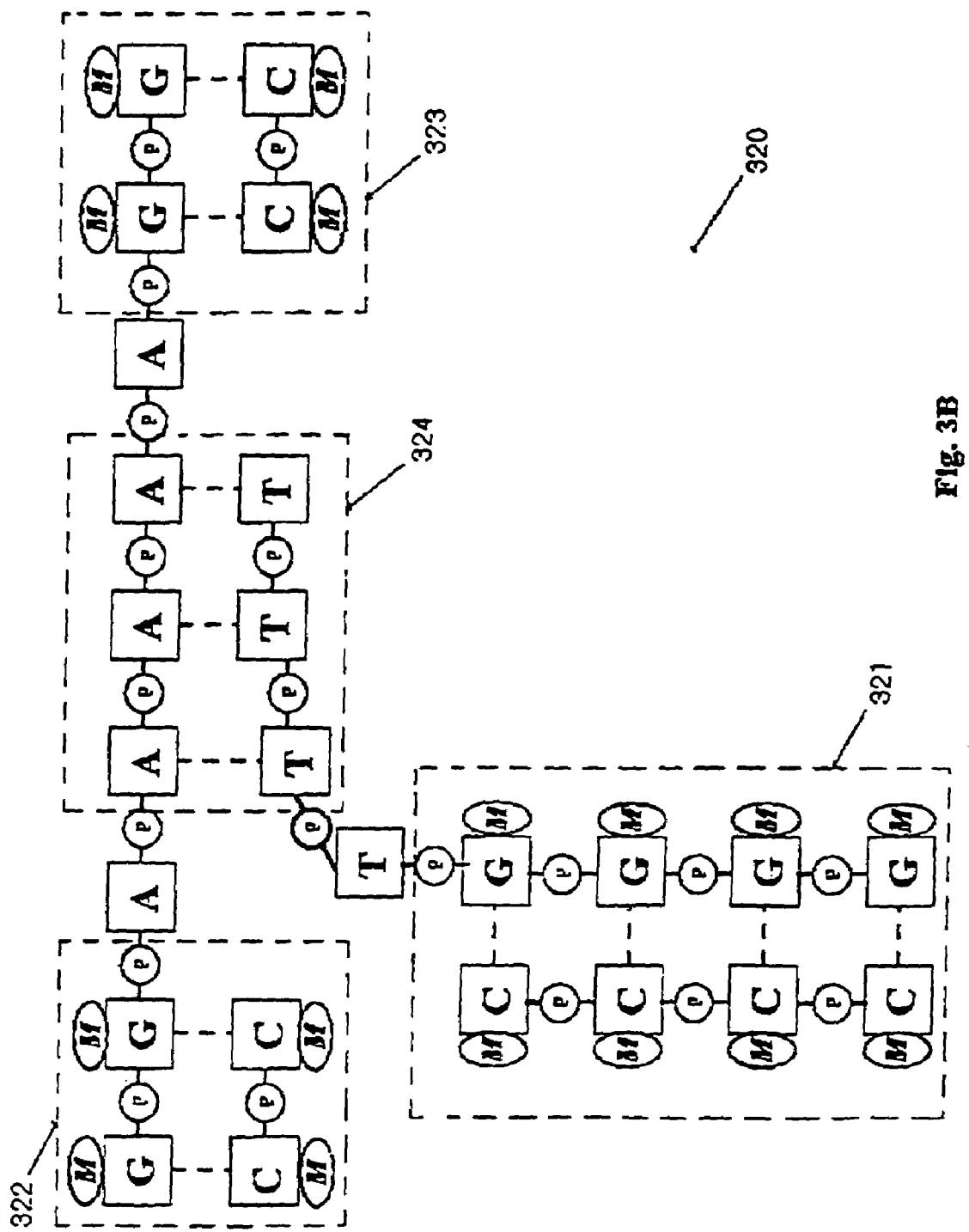
FIG. 3B schematically illustrates a DNA SET transistor based on M-DNA technique according to an embodiment of the invention.

FIG. 3B schematically illustrates a DNA SET transistors 320 with M-DNA conductive strands. The doted squares 321, 322 and 323 represent the M-DNA part of the molecule, while the doted square 324 represents the active core of the DNA SET transistor 320. The operation of the DNA SET transistor 320 is similar to the DNA SET transistor 300, which has been described hereinabove.

Figure 3C:
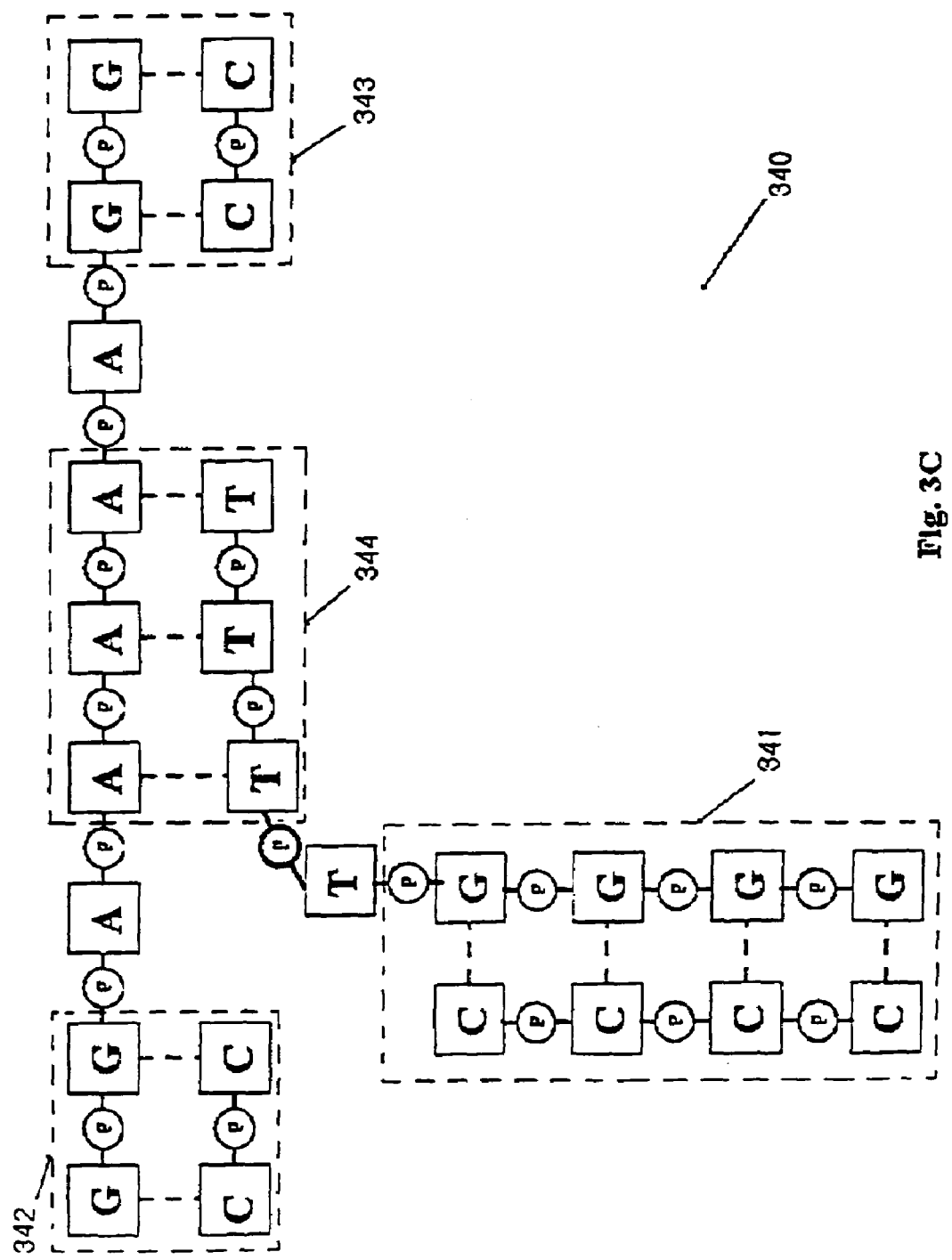
FIG. 3C schematically illustrates a DNA SET transistor based on Poly-G Poly-C technique according to an embodiment of the invention.

FIG. 3C schematically illustrates a DNA SET transistors 340 with Poly-G Poly-C conductive strands. The doted squares 341, 342 and 343 represents the Poly-G Poly-C part of the molecule, while the doted square 344 represents the active core of the DNA SET transistor 340. The operation of the DNA SET transistor 340 is similar to the DNA SET transistor 300, which has been described hereinabove.

Figure 4:
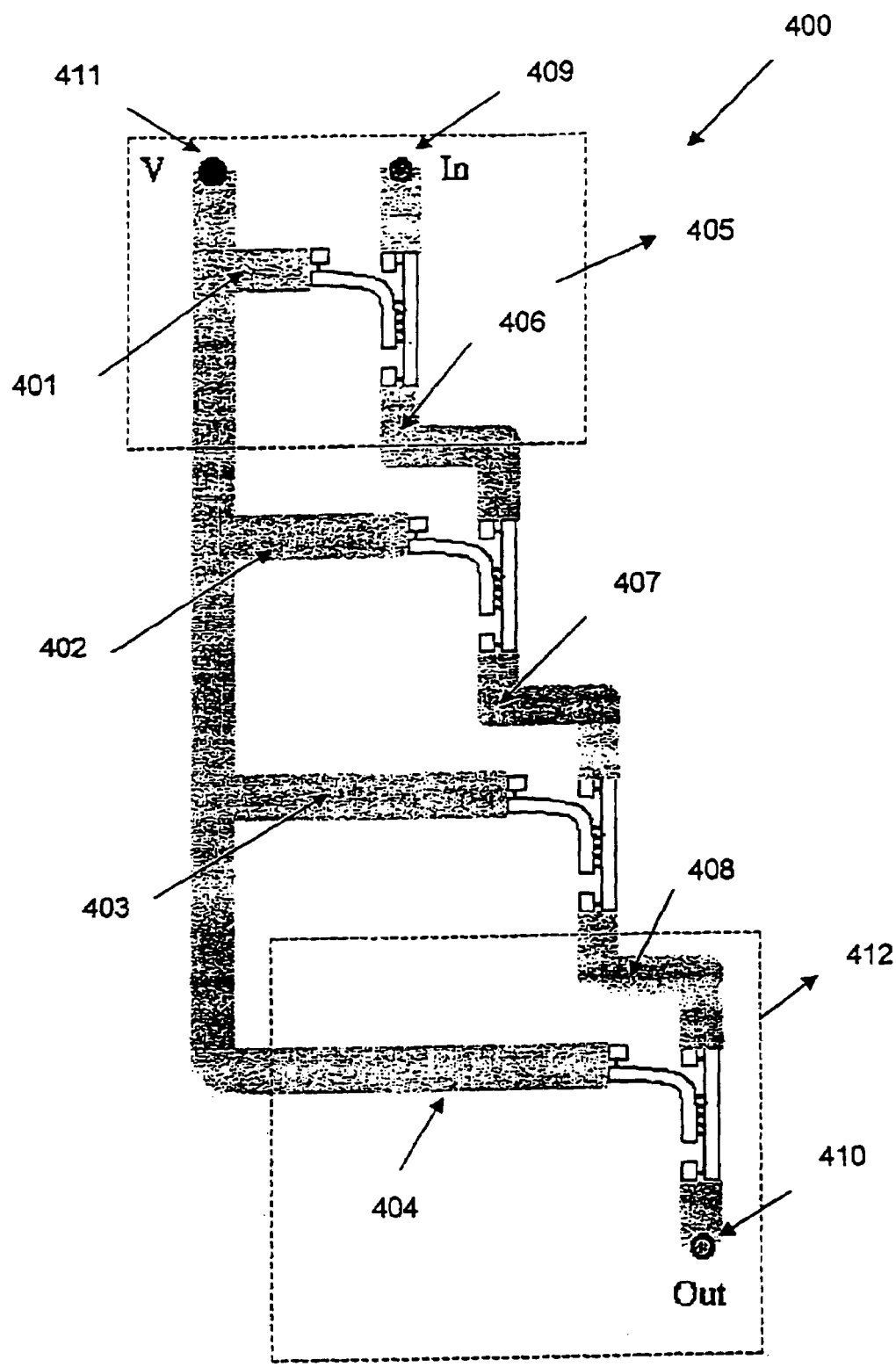
FIG. 4 schematically illustrates a DNA resistor built from four SET transistor elements in a series, with a constant over-threshold gate voltage.

FIG. 4 schematically illustrates a DNA resistor 400 built from four SET transistor elements in a series, with a constant over-threshold gate voltage. The doted line 405 represent a single DNA-based SET transistor element (i.e. the first DNA-based SET transistor element) as described hereinbefore with reference to FIG. 3A. The gates 401, 402, 403, 404 of the four DNA-based SET transistor elements are connected serially one to another and so the M-DNA part of the molecule (i.e. the drain) 406, 407, 408. The input voltage is supplied to first DNA-based SET transistor element 405 at the edge of the M-DNA part (i.e. the source) 409. The gate voltage is supplied to all the gates 401–404 simultaneity.

The output voltage 410 of the DNA resistor 400 is output from the last DNA-based SET transistor element 412. The resistance of such element is four time that of a single DNA-based SET transistor element.

Figure 5A:
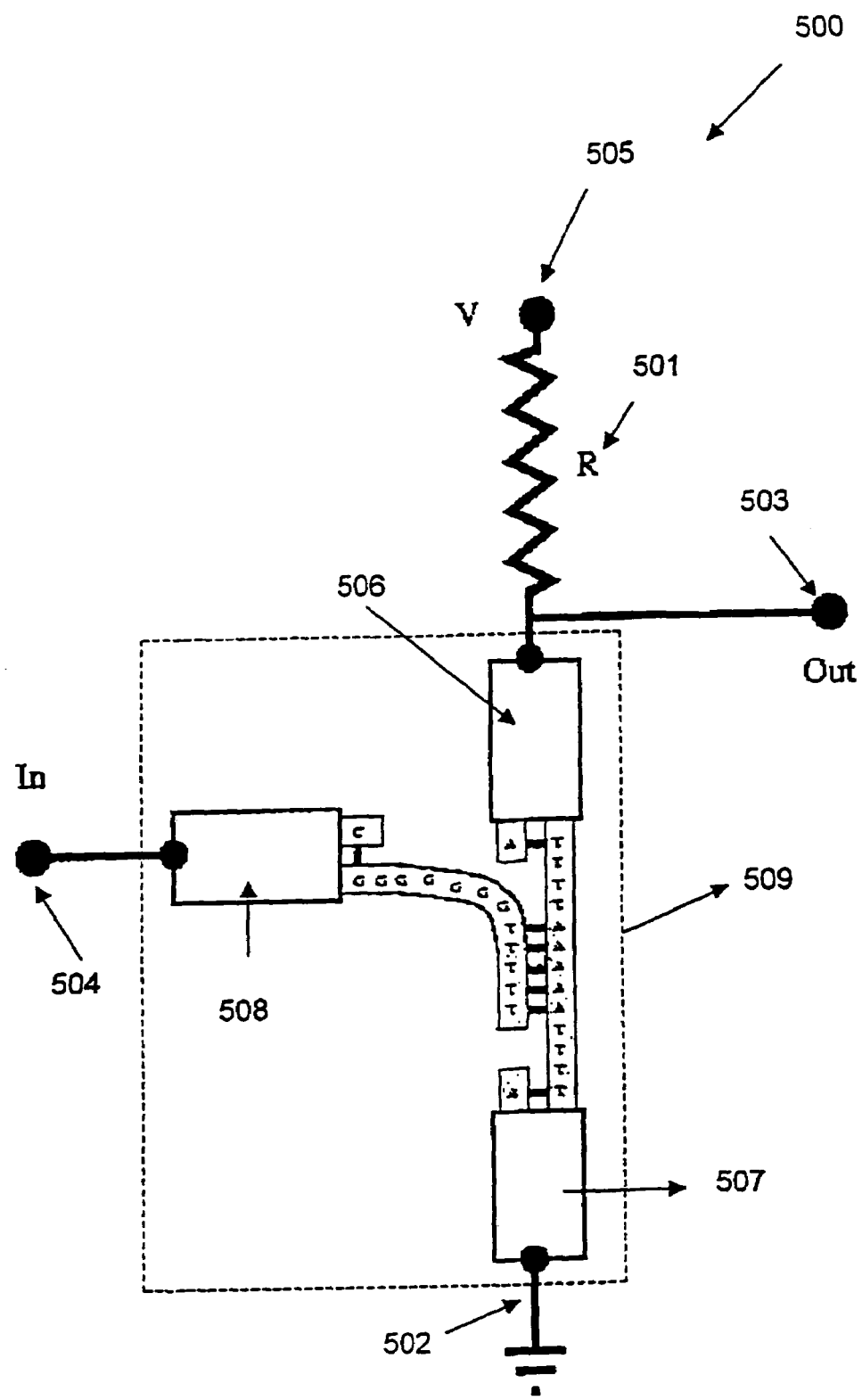
FIG. 5A is a schematic representation of a DNA NOT gate.

The next step after the fabrication of a DNA-based transistor is to construct logical electronic gates. NOT gate outputs high voltage for low input voltage and vice versa. It can be constructed from a transistor and a resistor with resistance of the same order and preferably much higher than that of the transistor. There are a few methods for fabricating DNA based resistors, such as coating the DNA with a poor conductor. However, one of the simplest ways to make such a resistor is by using a DNA SET transistor with a constant over-threshold gate voltage. By placing a few of such "resistors" in series we increase the resistivity to the desired value. A resistor composed of four SET transistor elements is illustrated in FIG. 4. Such resistor can be used together with the SET transistor to construct logical gates. For example, FIG. 5A is schematic representation of a DNA NOT gate 500. The DNA NOT gate 500 is built from a single SET transistor element with a resistor 501 connected between the coated DNA (i.e. the source) 506 and the supplied voltage 505. The coated DNA (i.e. the drain) 507 is connected to the ground 502. The input data 504 is fed to the gate 508 and the output data 503 is from the junction of the resistor 501 and the source 506. When $V_{in}$ is at low voltage level (i.e. '0') all the source 506 voltage reaches the output 503. When $V_{in}$ is at high voltage level (i.e. '1') a current flows through the SET transistor 509, so that four fifths of the source 506 voltage (assuming that the resistor describe in FIG. 4 is used) falls on the resistor and the "out" voltage 503 is only a fifth of the "in" voltage 504. By this mode the NOT operation is achieved.

Figure 5B:
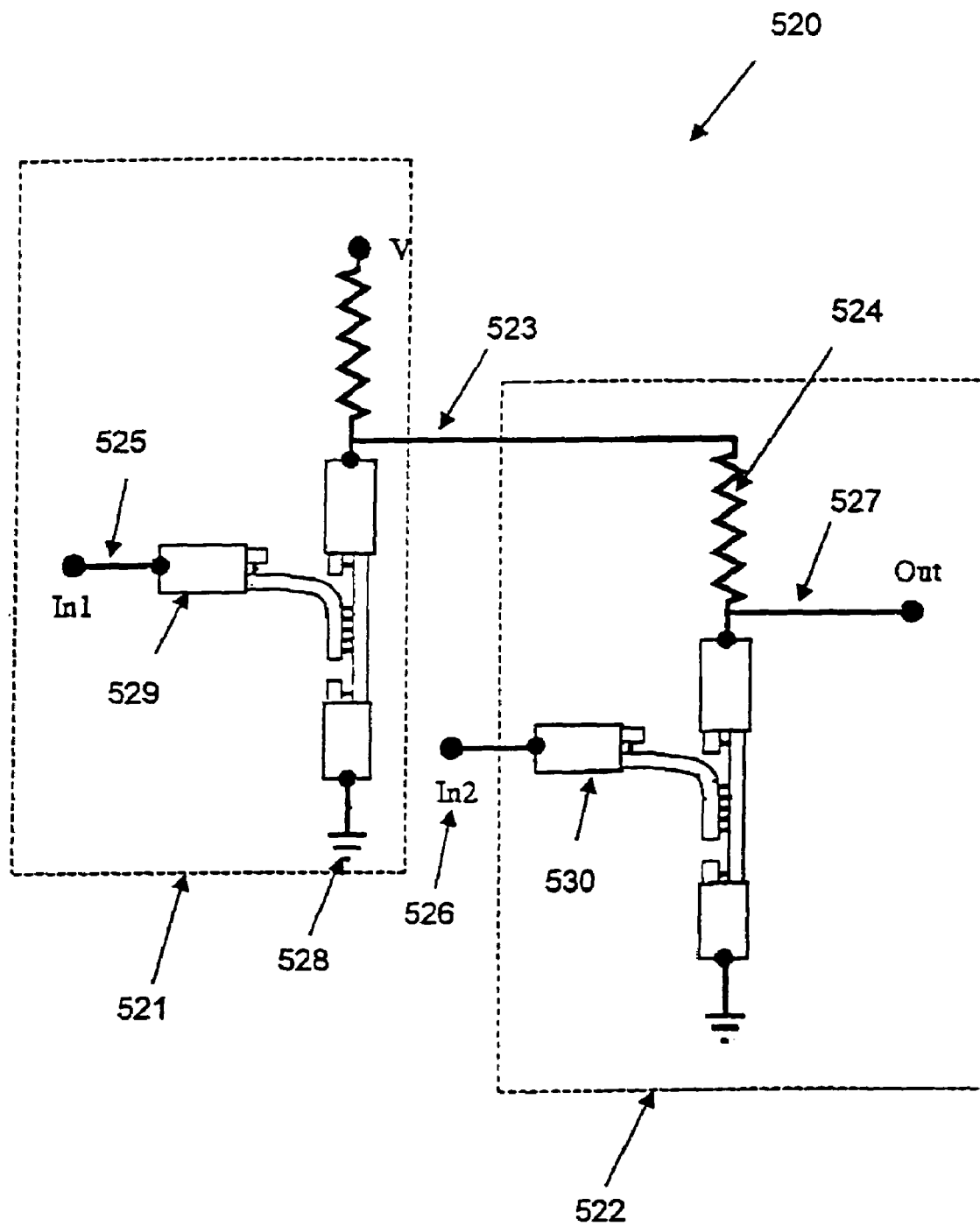
FIG. 5B is a schematic representation of a DNA NOR gate.

In a similar way a NOR gate 520 is obtained as shown in FIG. 5B. The NOR gate is built from two NOT elements 521, 522 where the output 523 of the first NOT element 521 is connected to the resistor 524 of the second NOT element 522 as it voltage supply. The NOR gate has two data inputs In1 525 and In2 526, and single output data 527. The two transistors shortcut the input signals 525, 526 to the ground 528 if at least one of the control gates 529 or 530 is set to high voltage. Again, we can use a series of constantly activated SET transistor to construct the resistors. Using NOT and NOR gates, any logical operation can be realized.

Figure 6:
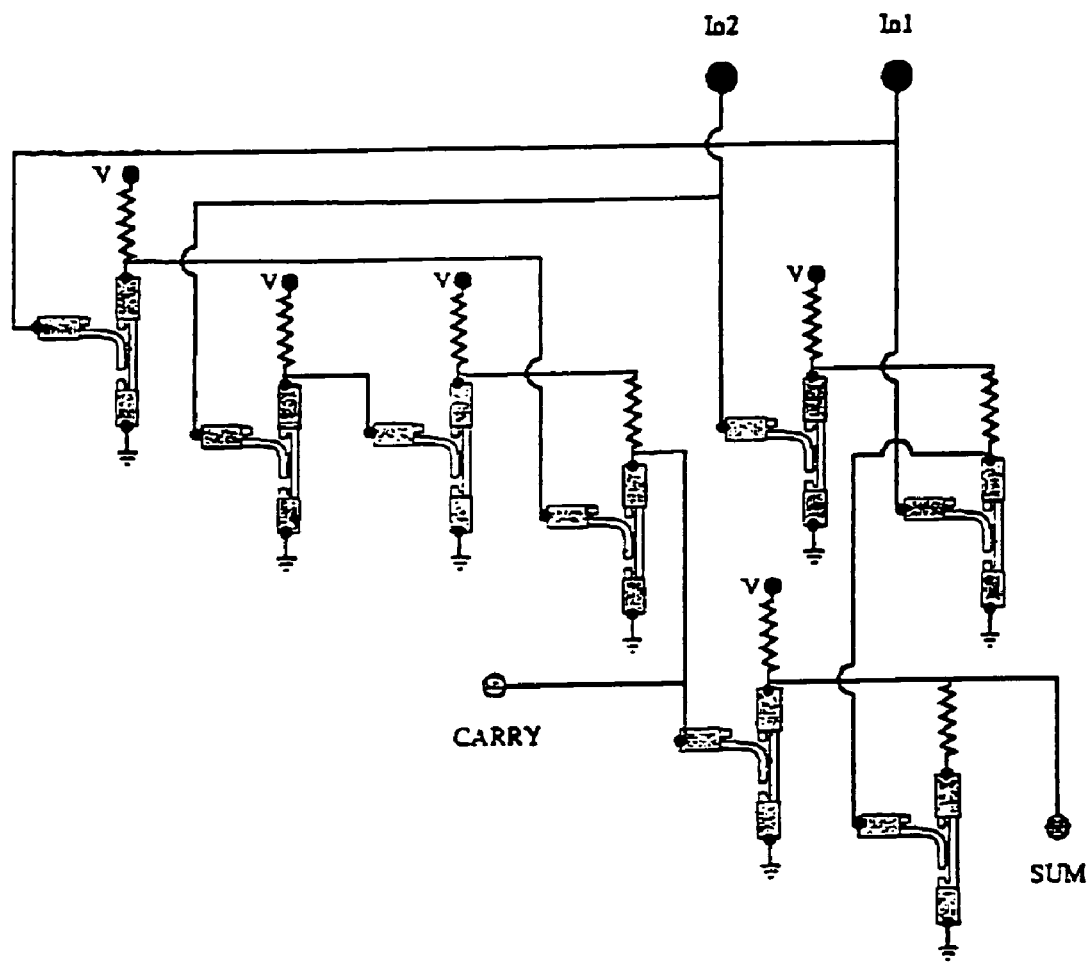
FIG. 6 is an example of two-bit sum circuit.

This fact is illustrated by the following example, in which a two-bit sum circuit 600 is shown in FIG. 6. The output reads: In1+In2. By combining a few such elements in a straightforward way, it is possible to construct a register counter (Out=In+1) a SUM circuit (OUT=In1+In2) and many other arithmetical operations for arbitrary number of bits.

Figure 7:
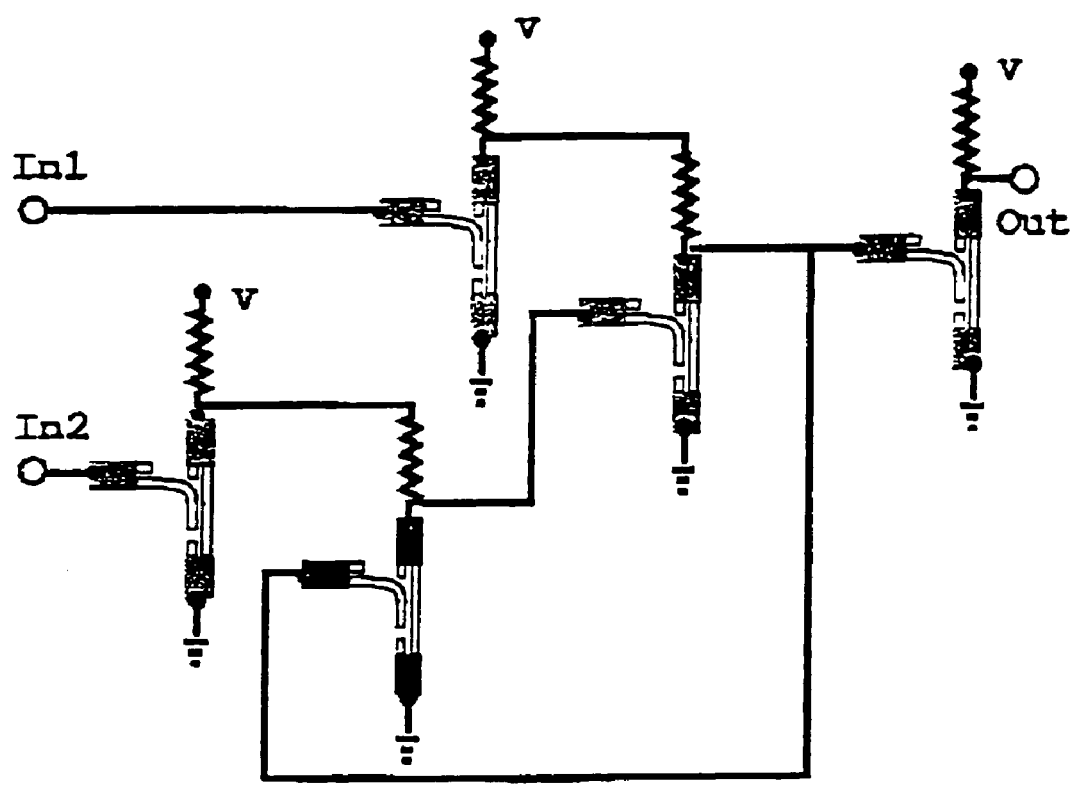
FIG. 7 shows a memory bit, which is a flip-flop element, based on two NOR and one NOT gates.

Using logical gates it is also possible to construct a memory bit, which is a flip-flop element. Setting one of the controls to high voltage sets the output to high. The other control sets the output to low. However, the output does not change after the control signal decays. An example of such element, based on two NOR and one NOT gates, is shown in FIG. 7.

An illustrative and non-limitative actual protocol for a circuit construction, provides in simplified form, is as follows:

1) As a first step a large collection of the basic components is fabricated: transistors, logical gates, and logical operations elements and memory registers. Elements of each type can be fabricated separately, and be identical or of limited number of variations.

2) Assuming, for example, that it is desired to fabricate SET transistor elements, a large population of DNA strands of five types is first synthesized: one continuous main strand between the source and the drain of the transistor, two complementary strands for each side, one gate strand which has, at one edge (the active edge), a short sequence which is the complementary of the main strand middle part (the active core of the transistor) and a complementary strand of the gate, there are some short sequence at the edges of the main strand and the non-active edge of the gate strand which are kept without complementary pairing. These three exposed coded edges enable connection of the elements to the integrated circuit at the exact desired location.

3) The strands are mixed in a solution, and are allowed to combine. Then, enzymes, which are designed to combine to the DNA and protect the coded edges and the active cores, are added to the solution.

4) The strands are now mutation to M-DNA, and then standard biochemical methods are used to remove the protecting enzymes. This procedure provides a large amount of DNA SET transistor. In a similar way, more complicated elements may be fabricated in large numbers. It should be noted, however, that increasing the size of the elements produced may reduce their mobility in the solution and limit the rate in which the circuit is assembled.

5) After all the basic elements are prepared, the circuit is gradually constructed. Construction can start at some junction in the circuit in which there is a SET transistor. Double strand molecules are added (which will serve as wires in our circuit) with exposed single stranded edges complementary to the coded edges of the SET transistor. Construction continues by adding the elements, which correspond to the other edges of the wires, adding more wire to be combined to the nuclei that have been generated, and so on until the network is completed.

6) Then enzymes are used again to protect the active cores of the elements, and to coat the entire circuit.

The above protocol has been described in simplified form, for the sake of simplicity and to assist in the understanding of the general principles. The skilled person will, however, be easily able to decide on specific technical details that he wishes to employ for a given purpose.

Using such constructions as described above, any digital computational circuit can be realized, at a nanometric scale. In fact the only essential component that should be added to such electronic computational circuit is a clock to synchronize the system. Nevertheless, the concept of a DNA as substrate for such circuits shows that it is possible to adopt a new approach for DNA-based nanoelectronics architecture. The fact that it is quite easy to synthesize DNA with repeating patterns can be exploited to fabricate a huge periodic network built from many identical simple elements. This, as will be apparent to the skilled person, is substantially easier than to fabricate an exact "tailor-made" logical circuit. By designing simple artificial "neurons" and combining them together it is possible to construct a hardware realization of a neural network. Such networks performs some types of calculations such as pattern recognition (which are usually associated with highly parallel computations) faster than both conventional computers and brains of living creatures.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. A transistor comprising three conductive segments of DNA molecules connected to an active core, wherein the active core comprises a fourth DNA segment, wherein a first and a second of said three conductive segments are linked to said active core via phosphorus bridges ("P-bridges"), wherein a third of said conductive segments is capacitively linked to said active core via hydrogen bonds ("H-bonds"), and wherein said third segment is configured to electrically modulate current flowing across said active core through said fourth DNA segment through said P-bridges between said first and second of said three conductive segments in response to a gate voltage applied to said third conductive segment.

2. The transistor of claim 1, wherein the conductive segments of DNA molecules are M-DNA conductive strands.

3. The transistor of claim 1, wherein the conductive segments of DNA molecules are Poly-G or Poly-C DNA or Poly-CG DNA conductive strands.

4. The transistor of claim 1, further comprising a hopping mechanism across a tunnel junction, for electron transfer between the pair of conductive segments and said active core.

5. The transistor of claim 4, wherein said tunnel junction is a P-bridge.

* * * * *

SEQUENCE LISTING

```
<160> NUMBER OF SEQ ID NOS: 3

<210> SEQ ID NO 1
<211> LENGTH: 13
<212> TYPE: DNA
<213> ORGANISM: Artificial Sequence
<220> FEATURE:
<223> OTHER INFORMATION: Exemplary grain sequence

<400> SEQUENCE: 1
ttttaaaaat ttt                                                    13

<210> SEQ ID NO 2
<211> LENGTH: 12
<212> TYPE: DNA
<213> ORGANISM: Artificial sequence
<220> FEATURE:
<223> OTHER INFORMATION: Exemplary gate sequence

<400> SEQUENCE: 2
tttttggggg gg                                                     12

<210> SEQ ID NO 3
<211> LENGTH: 12
<212> TYPE: DNA
<213> ORGANISM: Artificial Sequence
<220> FEATURE:
<223> OTHER INFORMATION: Exemplary gate sequence

<400> SEQUENCE: 3 ggggggggttt tt                                                    12
```